(12) United States Patent
Noguchi et al.

(10) Patent No.: US 11,317,027 B2
(45) Date of Patent: Apr. 26, 2022

(54) IMAGING UNIT AND IMAGING APPARATUS

(71) Applicant: CANON KABUSHIKI KAISHA, Tokyo (JP)

(72) Inventors: Koji Noguchi, Yokohama (JP); Yuya Okada, Yokohama (JP); Mitsutoshi Hasegawa, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 143 days.

(21) Appl. No.: 15/931,922

(22) Filed: May 14, 2020

(65) Prior Publication Data
US 2020/0374462 A1  Nov. 26, 2020

(30) Foreign Application Priority Data
May 22, 2019  (JP) .............................. JP2019-096334

(51) Int. Cl.
| | |
|---|---|
| *H04N 5/232* | (2006.01) |
| *H05K 1/02* | (2006.01) |
| *H05K 1/18* | (2006.01) |
| *H04N 5/225* | (2006.01) |
| *H05K 7/14* | (2006.01) |

(52) U.S. Cl.
CPC ....... *H04N 5/23287* (2013.01); *H04N 5/2252* (2013.01); *H04N 5/2257* (2013.01); *H05K 1/0277* (2013.01); *H05K 1/189* (2013.01); *H05K 7/1427* (2013.01); *H05K 2201/10121* (2013.01); *H05K 2201/10151* (2013.01)

(58) Field of Classification Search
CPC .................................................. H04N 5/23287
USPC ........................................................ 348/208.7
See application file for complete search history.

(56) References Cited

U.S. PATENT DOCUMENTS

2014/0168509 A1*  6/2014  Lee ...................... H04N 5/2256
                                                     348/374

FOREIGN PATENT DOCUMENTS

| JP | 7-38268 A | 2/1995 |
|---|---|---|
| JP | 2002-134860 A | 5/2002 |

* cited by examiner

*Primary Examiner* — Joel W Fosselman
(74) *Attorney, Agent, or Firm* — Venable LLP

(57) ABSTRACT

An imaging unit includes: an imaging sensor module having a printed wiring board on which an imaging element is provided; a flexible printed circuit board connected to a connecting portion of the printed wiring board; an elastic member provided on a face having the connecting portion of the printed wiring board; and an image stabilization unit having a fixing portion that fixes the flexible printed circuit board, the imaging sensor module is movable with respect to the image stabilization unit, and the elastic member holds the flexible printed circuit board.

14 Claims, 9 Drawing Sheets

IMAGING UNIT AND IMAGING APPARATUS

BACKGROUND OF THE INVENTION

Field of the Invention

The present invention relates to an imaging unit and an imaging apparatus.

Description of the Related Art

Japanese Patent Application Laid-Open No. H07-38268 discloses a flexible unit formed by soldering a face of a hard substrate and a face of a flexible substrate to each other and proposes a casing assembling structure of the flexible unit that absorbs external force applied to the flexible substrate and prevents an electrical conduction failure due to detachment at the solder connecting portion. Japanese Patent Application Laid-Open No. H07-38268 discloses that a hole provided in the flexible substrate is engaged to a protrusion shaft of a back cover assembled with the flexible unit, thereby external force applied to the flexible substrate is absorbed, and an electrical conduction failure due to detachment at the solder connecting portion is prevented.

Further, Japanese Patent Application Laid-Open No. 2002-134860 proposes a flexible printed wiring board in which electrical connection to a printed substrate can be firmly and easily made. Japanese Patent Application Laid-Open No. 2002-134860 discloses that a notch part is formed near a reinforcement land in a flexible wiring board on which a contact point pattern to be connected to the printed substrate and a reinforcement land are formed. Japanese Patent Application Laid-Open No. 2002-134860 discloses that, with the notch part being formed in such a way, a detaching stress applied to the reinforcement land used for reinforcing connection of the contact point pattern is dispersed.

In the art disclosed in Japanese Patent Application Laid-Open No. H07-38268, however, when a printed wiring board such as a hard substrate moves due to vibration or the like, external force occurs not only in a structure part that absorbs external force but also directly in a junction part between the printed wiring board and the flexible substrate. On the other hand, in the art disclosed in Japanese Patent Application Laid-Open No. 2002-134860, since a connection region of a reinforcement terminal such as a reinforcement land is required in a printed wiring board, the size of the printed wiring board will increase.

SUMMARY OF THE INVENTION

The present invention intends to provide an imaging unit and an imaging apparatus that can reduce a load occurring in a connecting portion between a flexible printed circuit board and a printed wiring board without involving an increase in size of the printed wiring board.

According to one aspect of the present invention, provided is an imaging unit including: an imaging sensor module having a printed wiring board on which an imaging element is provided; a flexible printed circuit board connected to a connecting portion of the printed wiring board; an elastic member provided on a face having the connecting portion of the printed wiring board; and an image stabilization unit having a fixing portion that fixes the flexible printed circuit board. The imaging sensor module is movable with respect to the image stabilization unit, and the elastic member holds the flexible printed circuit board.

According to another aspect of the present invention, provided is an imaging apparatus including a casing and an imaging unit inside the casing, and the imaging unit is the imaging unit described above.

Further features of the present invention will become apparent from the following description of exemplary embodiments with reference to the attached drawings.

DESCRIPTION OF THE EMBODIMENTS

Embodiments for implementing the present invention will be described below in detail with reference to the drawings. Note that the present invention is not limited to the following embodiments and can be modified as appropriate within a scope not departing from the spirit thereof. Further, throughout the drawings described below, those having the same function are labeled with the same reference, and the description thereof may be omitted or simplified.

First Embodiment

An imaging unit according to a first embodiment will be described with reference to FIG. 1 to FIG. 5.

Figure 1:
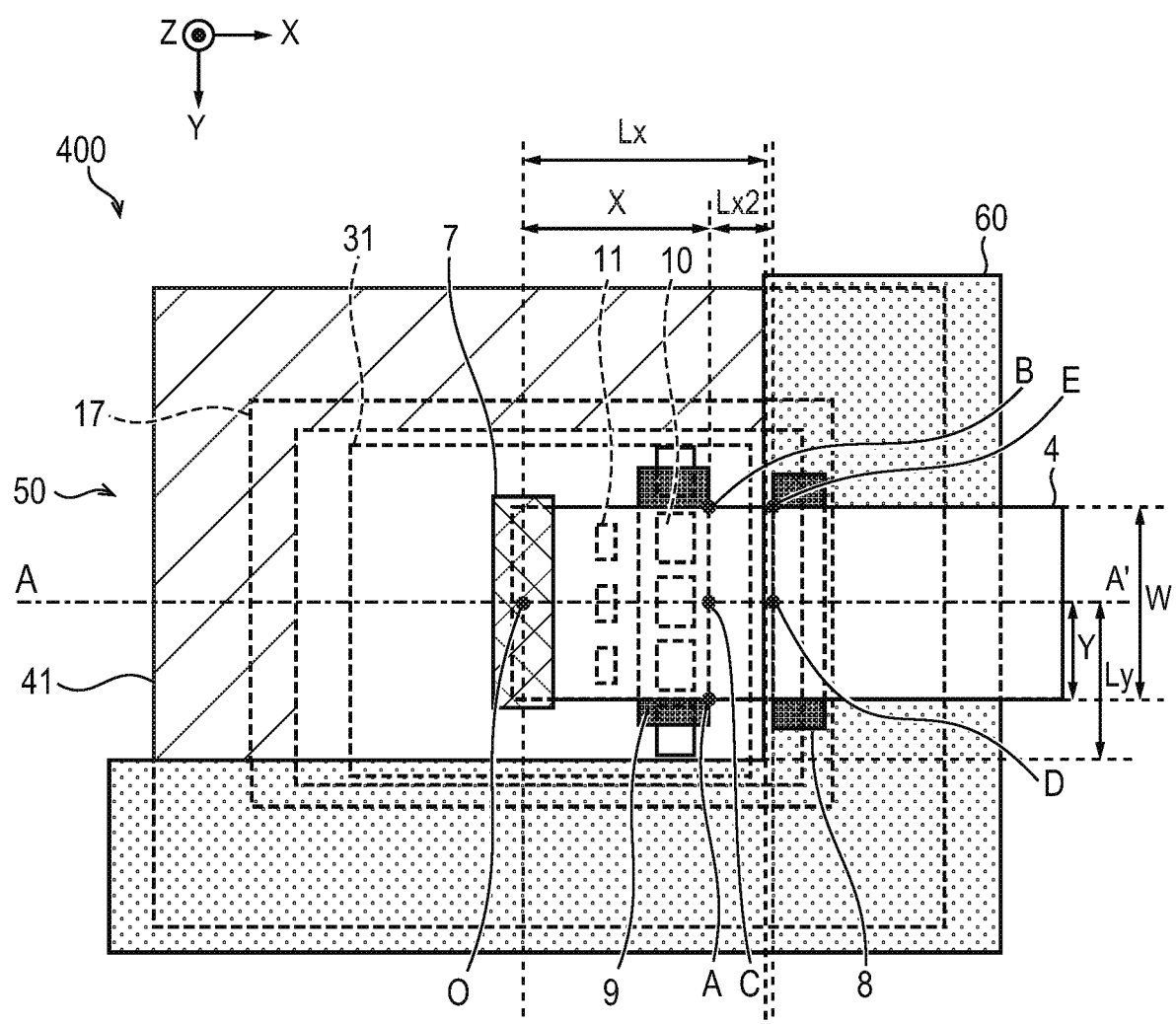
FIG. 1 is a schematic top view illustrating a general configuration of an imaging unit according to a first embodiment.
Figure 2:
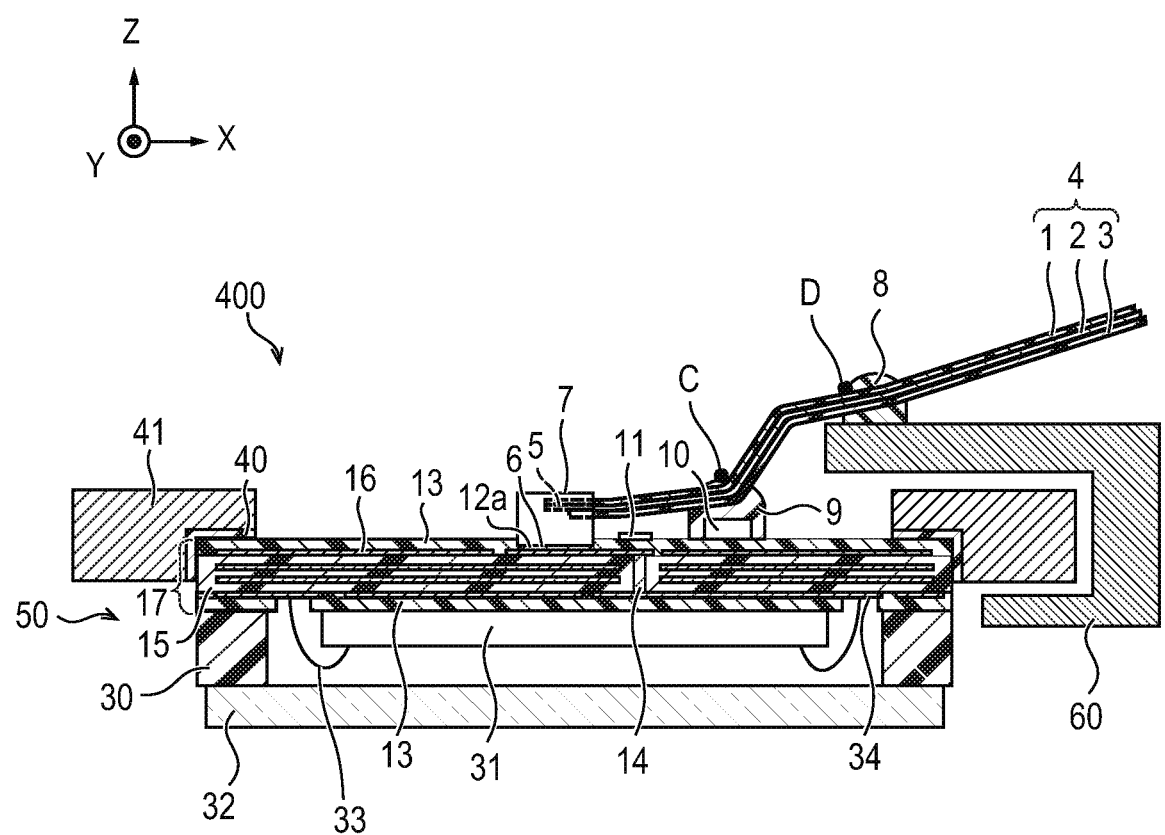
FIG. 2 is a schematic sectional view illustrating a general configuration of the imaging unit according to the first embodiment.

First, the structure of the imaging unit according to the present embodiment will be described with reference to FIG. 1 and FIG. 2. FIG. 1 is a schematic top view illustrating a general configuration of the imaging unit according to the present embodiment. FIG. 2 is a schematic sectional view illustrating a general configuration of the imaging unit according to the present embodiment and illustrates a cross section taken along a line A-A' in FIG. 1.

As illustrated in FIG. 1 and FIG. 2, an imaging unit 400 has an imaging sensor module 50 having a printed wiring board 17, an image stabilization unit 60, and a flexible printed circuit board 4.

Herein, each coordinate axis and direction of an X-axis, a Y-axis, and a Z-axis of an XYZ coordinate system that is a rectangular coordinate system used in the following description will be defined. First, an axis perpendicular to a primary face of the printed wiring board 17 of the imaging sensor module 50 is defined as Z-axis. Further, an axis parallel to the primary face of the printed wiring board 17 and along the direction in which a connector 7 of the printed wiring board 17 and the flexible printed circuit board 4 connected to the connector 7 are arranged is defined as X-axis. Further, an axis orthogonal to the X-axis and the Z-axis is defined as Y-axis. In the XYZ coordinate system whose coordinate axes are defined in such a way, directions parallel to the X-axis are defined as X directions. In the X directions, a direction from the connector 7 side to the flexible printed circuit board 4 side is defined as +X direction, and a direction opposite to the +X direction is defined as −X direction. Further, directions parallel to the Y-axis are defined as Y directions. In the Y directions, a direction from the left side to the right side with respect to the +X direction is defined as +Y direction, and a direction opposite to the +Y direction is defined as −Y direction. Further, directions parallel to the Z-axis are defined as Z directions. In the Z directions, a direction from an imaging sensor element 31 side of the imaging sensor module 50 to the connector 7 side is defined as +Z direction, and a direction opposite to the +Z direction is defined as −Z direction. Further, rotational directions around the Z-axis are defined as θ directions. In the θ directions, a clockwise direction with respect to the −Z direction is defined as +θ direction, and a direction opposite to the +θ direction is defined as −θ direction.

The flexible printed circuit board 4 has a flexible base 1, a flexible wiring layer 2, and a coverlay 3. The flexible printed circuit board 4 has one or more conductive layers as the flexible wiring layer 2 and is formed such that the conductive layers are stacked via the flexible base 1 as an insulating layer. Note that, although a case where the wiring layer in the flexible printed circuit board 4 is a single layer is described in the present embodiment, the wiring layer is not limited to a single layer, and the wiring layer may be multiple layers.

The flexible base 1 is, for example, a sheet-like or film-like insulating base material made of a resin or the like and has bendability and flexibility. Thus, the flexible printed circuit board 4 is formed so as to be deformed such as bent. The insulating material forming the flexible base 1 may be any material as long as it has electrical insulation. For example, as the insulating material forming the flexible base 1, polyimide, polyethylene-terephthalate, or the like may be used.

The flexible wiring layer 2 is a conductive layer formed of a copper foil, another metal foil, or the like. The flexible wiring layer 2 has a wiring pattern. The flexible wiring layer 2 is formed on one face or both faces of the flexible base 1. The conductive member forming the flexible wiring layer 2 is a substance having higher electrical conductivity and thermal conductivity than the insulating material, for example, a metal such as copper, silver, gold, or the like. Note that the flexible wiring layer 2 may be formed on at least one face of the flexible base 1.

The coverlay 3 is an insulating layer that protects a circuit formed of the flexible wiring layer 2. The coverlay 3 is formed of a coverlay film, an overcoat, or the like. The coverlay 3 is formed so as to cover the flexible wiring layer 2 on a face of the flexible base 1 on which the flexible wiring layer 2 is formed.

The coverlay 3 is not formed at one of the ends of the flexible printed circuit board 4, and the flexible wiring layer 2 is exposed. The exposed portion of the flexible wiring layer 2 forms first electrodes 5. A plurality of first electrodes 5 is aligned and arranged at a predetermined pitch, for example. In such a way, the first electrodes 5 are formed of the flexible wiring layer 2 exposed at the end of the flexible printed circuit board 4. The one end of the flexible printed circuit board 4 at which the first electrodes 5 are formed is configured as an insertion terminal. Note that, although not illustrated, the other end of the flexible printed circuit board 4 is also configured as an insertion terminal at which electrodes are formed in the same manner.

The one of the insertion terminals of the flexible printed circuit board 4 at which the first electrodes 5 are formed is inserted in and connected to the connector 7 mounted on the printed wiring board 17 of the imaging sensor module 50 described below. Although not illustrated, the other insertion terminal of the flexible printed circuit board 4 is inserted in a connector mounted on a printed wiring board of an image processing unit. In such a way, the flexible printed circuit board 4 electrically connects an imaging unit 400 and the image processing unit to each other.

Further, the connection position between the flexible printed circuit board 4 and the printed wiring board 17 is located at least near the center of the imaging sensor element 31 or overlaps at least the imaging sensor element 31 in plan view from a direction perpendicular to the printed wiring board 17 when seen through from the top face. That is, at least a part of the flexible printed circuit board 4 overlaps at least a part of the imaging sensor element 31 in plan view from a direction perpendicular to the printed wiring board 17.

The imaging sensor module 50 has the printed wiring board 17, the imaging sensor element 31, a frame 30, a cover glass 32, and the connector 7. The printed wiring board 17 is adhered and fixed to a metal frame 41 by an adhesive agent 40 such as an ultraviolet curable resin or the like, for example. The imaging sensor module 50 is held by the image stabilization unit 60 so as to be movable with respect to the image stabilization unit 60, as described later.

The connector 7 is mounted on one face of the printed wiring board 17 on the side to which the flexible printed circuit board 4 is connected. The frame 30 is arranged by being attached on the circumference end of the other face of the printed wiring board 17. The cover glass 32 is attached to the frame 30 so as to be parallel to the printed wiring board 17.

The imaging sensor element 31 is a solid state imaging element such as a Complementary Metal Oxide Semiconductor (CMOS) image sensor, a Charge Coupled Device (CCD) image sensor, or the like, for example. The imaging sensor element 31 is attached to the printed wiring board 17 so as not to contact with the cover glass 32 in a hollow portion surrounded by the printed wiring board 17, the cover glass 32, and the frame 30. The imaging sensor element 31 is electrically connected at a wire pad 34 of the printed wiring board 17 through a metal wire 33. The wire pad 34 is a component plated with Au, for example.

Note that, while the case where the frame 30 is attached is described in the present embodiment, the arrangement part thereof is not limited to be a part on the circumference edge of the printed wiring board 17. Further, the arrangement part of the imaging sensor element 31 may be a part inside the hollow portion of the printed wiring board 17 having a counter-bore, such as a cavity substrate, for example.

The printed wiring board 17 has a printed wiring base 15, wiring layers 16, and a solder resist layer 13. The printed wiring board 17 is formed such that the plurality of wiring layers 16 are stacked via the printed wiring base 15. Unlike the flexible printed circuit board 4, the printed wiring board 17 is a rigid wiring substrate.

For example, the printed wiring board 17 may be formed of a glass epoxy material or may be formed of a ceramic substrate. Further, a printed circuit board in which the imaging sensor element 31 is arranged on a ceramic substrate and the ceramic substrate and the printed wiring board 17 are connected by a pair of electrodes via solder may be used. For example, an imaging sensor unit of a Land Grid Array (LGA) type or a Ceramic Leadless Chip Carrier (CLCC) type may be used.

Note that, although a case where the number of wiring layers 16 in the printed wiring board 17 is four is described in the present embodiment, the number of layers is not limited to four. A single wiring layer or multiple wiring layers may be included in the printed wiring board 17, that is, the number of layers may be less than or equal to four or may be greater than or equal to four.

The printed wiring base 15 is, for example, a substrate-shape insulating base made of a hard composite material or the like. Unlike the flexible base 1, the printed wiring base 15 is hard. The insulating material forming the printed wiring base 15 may be any material as long as it has electrical insulation. For example, the printed wiring base 15 may be a resin substrate made of a cured resin such as a cured epoxy resin or a ceramic substrate using ceramics.

Each wiring layer 16 is a conductive layer made of a copper foil, another metal foil, or the like. The wiring layer 16 has a wiring pattern. The wiring layer 16 is formed on one face or both faces of the printed wiring base 15. Further, one or a plurality of wiring layers 16 is formed inside the printed wiring base 15. FIG. 2 illustrates a case where four layers in total of the wiring layers 16 are formed on the both faces and inside the printed wiring base 15. Further, a via 14 electrically connecting the wiring layers 16 is formed inside the printed wiring base 15. The conductive member of the wiring layers 16, the via 14, and the like is a substance having higher electrical conductivity and thermal conductivity than an insulating material, for example, a metal such as copper, gold, or the like.

The solder resist layer 13 is an insulating protective film that protects a circuit formed of the wiring layers 16. The solder resist layer 13 is formed of a hardened liquid solder resist, a film-like solder resist, or the like. The solder resist layer 13 is formed so as to cover the wiring layer 16 on one face of the printed wiring board 17 on the side to which the flexible printed circuit board 4 is connected. Further, the solder resist layer 13 is formed so as to cover the wiring layer 16 also on the other face of the printed wiring board 17 on the side to which the imaging sensor element 31 is attached.

An opening in which the wiring layer 16 is exposed is formed in the solder resist layer 13. The exposed portion of the wiring layer 16 forms second electrodes 6. A plurality of second electrodes 6 is aligned and arranged at a predetermined pitch, for example. The second electrodes 6 are arranged at the center part of the printed wiring board 17, for example. The connector 7 is electrically connected to and mounted on the second electrodes 6 via conductive members 12a such as solder.

The flexible printed circuit board 4 is inserted in and connected to the connector 7, which is a connecting portion, so as to be parallel to the printed wiring board 17. Note that the direction in which the flexible printed circuit board 4 is inserted in the connector 7 is not limited to the above, and the shape of the connector 7 may be changed as appropriate in accordance with the insertion direction. For example, the connector 7 may be shaped such that the flexible printed circuit board 4 is inserted perpendicularly to the printed wiring board 17.

Note that, although the connector 7 is arranged in the center part of the printed wiring board 17, the arrangement is not limited thereto. The connector 7 may be arranged at any position that at least partially overlaps the imaging sensor element 31 in plan view from a direction perpendicular to the printed wiring board 17, that is, when viewed in plan from the primary face of the printed wiring board 17.

On one face of the printed wiring board 17 on which the connector 7 is mounted, a first component group 10 including a plurality of electronic components is provided on the side of the connector 7 in which the flexible printed circuit board 4 is inserted. The first component group 10 is not particularly limited but may be a passive component such as a laminated ceramic capacitor, for example. The plurality of electronic components included in the first component group 10 may be the same electronic components as each other or may be different electronic components from each other.

Further, a second component group 11 including a plurality of electronic components may be provided on a face of the printed wiring board 17 between the flexible printed circuit board 4 and the printed wiring board 17. The plurality of electronic components included in the second component group 11 may be the same electronic components as each other or may be different electronic components from each other.

Note that, although not illustrated, the minimum components required for the operation of the imaging unit 400 are mounted on the printed wiring board 17.

The image stabilization unit 60 supports the metal frame 41 such that the imaging sensor module 50 fixed to the metal frame 41 is movable in the X directions and the Y directions and rotatable in the θ directions. The image stabilization unit 60 can compensate hands movement by moving or rotating the imaging sensor module 50 in accordance with the hands movement. The image stabilization unit 60 has an L-shape, for example, and is configured to support the metal frame 41 having a rectangular external shape from adjacent two edge sides of the metal frame 41. In such a way, the image stabilization unit 60 is provided above the circumference edge of a face having the connector 7 of the printed wiring board 17 included in the imaging sensor module 50.

The flexible printed circuit board 4 connected to the connector 7 of the printed wiring board 17 is partially fixed onto the first component group 10 on the printed wiring board 17 by a flexible elastic member 9. In such a way, a part of the flexible printed circuit board 4 is fixed onto the printed wiring board 17 by the elastic member 9. The elastic member 9 is a thermosetting resin, a cold setting resin, an ultraviolet curable resin, or the like, for example, and preferably a cold setting resin or an ultraviolet curable resin among other things. This is because it is possible to fix a part of the flexible printed circuit board 4 onto the printed wiring board 17 without exposing electronic components mounted on the printed wiring board 17 to high temperature. For example, the elastic member 9 is adhered and fixed to the first component group 10 and the flexible printed circuit board 4. Note that the elastic member 9 may be any member that can hold the flexible printed circuit board 4.

Further, the flexible printed circuit board 4 is partially fixed onto the image stabilization unit 60 by an insulating resin 8 for a countermeasure against noise. For example, the insulating resin 8 is adhered and fixed to the image stabilization unit 60 and the flexible printed circuit board 4. In such a way, a part of the flexible printed circuit board 4 is fixed onto the image stabilization unit 60 by the insulating resin 8 that functions as a fixing portion. The insulating resin 8 is a thermosetting resin, a cold setting resin, an ultraviolet curable resin, or the like, for example, and preferably a cold setting resin or an ultraviolet curable resin among other things. This is because it is possible to fix a part of the flexible printed circuit board 4 onto the image stabilization unit 60 without exposing the image stabilization unit 60 to high temperature. Note that the fixing portion that fixes a part of the flexible printed circuit board 4 to the image stabilization unit 60 is not limited to the insulating resin 8. The fixing portion may be any member that can fix a part of the flexible printed circuit board 4 to the image stabilization unit 60 while ensuring insulation to the flexible printed circuit board 4. For example, a configuration in which an embossment (protrusion portion) is provided in the image stabilization unit 60 and the flexible printed circuit board 4 is fitted thereto may be employed. The elastic member 9 is arranged between the insulating resin 8 and the connector 7.

Note that a fixing part at which the flexible printed circuit board 4 is fixed by the elastic member 9 may be any position located on the printed wiring board 17 and located between the connector 7 and the insulating resin 8 on the image stabilization unit 60, and may not necessarily be on the first component group 10.

Further, the connector 7, the elastic member 9, and the insulating resin 8 are aligned and arranged on a straight line in the X direction. Specifically, the centroids of the connector 7, the elastic member 9, and the insulating resin 8 are aligned and arranged on a straight line in the X direction. Accordingly, the flexible printed circuit board 4 is in contact with the connector 7, which is a connecting portion, the elastic member 9, and the insulating resin 8, which is a fixing portion, in this order. Note that the arrangement of these positions is not limited to be on a straight line but may be changed as appropriate in accordance with the design or the like of the imaging unit 400.

In such a way, the imaging unit 400 according to the present embodiment is configured.

In digital cameras or video cameras, the number of pixels and a frame rate for a captured moving or static image have been improved. For imaging sensors such as a CMOS image sensor, there is a demand for a large amount of data transfer to or from an image processing large scale integration (LSI). Further, for image stabilization units that move an individual imaging sensor to perform image stabilization, there is a demand for further reduction in size of an imaging sensor module in order to reduce the size of a product or improve the performance of image stabilization inside a camera.

In general, a rigid wiring substrate of an imaging sensor module on which an imaging sensor is mounted and a rigid wiring substrate on which an image processing LSI is mounted are connected to each other by the flexible printed circuit board 4 via a connector. Further, a flexible substrate is fixed in an insulating resin or the like onto the image stabilization unit for a countermeasure against noise. The connector mechanically fixes the flexible printed circuit board by a metal spring or the like and causes electrodes of the flexible printed circuit board and electrodes inside the connector to contact with each other for electrical conduction. Since the connector mechanically fixes the flexible printed circuit board, a smaller connector results in weaker force to mechanically fix the flexible printed circuit board, which makes it difficult to ensure electrical conduction between the connector and the electrode of the flexible printed circuit board. Further, in the image stabilization unit, not only the conventional static load but also a dynamic load at image stabilization, such as vibration, occurs in an overlapping manner in the planar XY directions and the rotational θ directions, for example. Thus, to maintain the strength of a connecting portion between the flexible printed circuit board and the connector, a countermeasure to increase the size of the connector or the like is required. As a result, the size of the imaging sensor module will increase.

Accordingly, as with the art disclosed in Japanese Patent Application Laid-Open No. H07-38268 or Japanese Patent Application Laid-Open No. 2002-134860 described above, it has been proposed to absorb external force applied to a flexible substrate or disperse a detaching stress applied to a reinforcement land. As described above, however, in the art disclosed in Japanese Patent Application Laid-Open No. H07-38268, external force may be directly applied to a joining portion between the printed wiring board and the flexible substrate. Further, in the art disclosed in Japanese Patent Application Laid-Open No. 2002-134860, since a connection region of a reinforcement terminal is required for a printed wiring board, the size of the printed wiring board will increase. Thus, according to the arts disclosed in Japanese Patent Application Laid-Open No. H07-38268 or Japanese Patent Application Laid-Open No. 2002-134860, it is difficult to reduce a load occurring in a connecting portion between the flexible printed circuit board and the printed wiring board without involving an increase in size of the printed wiring board.

On the other hand, in the imaging unit 400 according to the present embodiment, the flexible printed circuit board 4 connected to the connector 7 is fixed onto the first component group 10 on the printed wiring board 17 by the elastic member 9. Thus, in the imaging unit 400 according to the present embodiment, it is possible to reduce a load occurring in a connecting portion between the flexible printed circuit board 4 and the printed wiring board 17 without involving an increase in size of the printed wiring board 17. This feature will be described below in detail.

For example, a case is considered where the imaging sensor module 50 moves in the XY directions or rotates in the θ directions due to image stabilization performed by the image stabilization unit 60 in a configuration in which the elastic member 9 and the insulating resin 8 are not provided. In such a case, a relative speed difference occurs between a connecting portion of the connector 7 on the imaging sensor module 50 that is an operating side and a connecting portion of the connector of the image processing unit that is a fixed side. Thereby, a mechanical load occurs toward the connecting portion. Further, also in a configuration in which a part of the flexible printed circuit board 4 is fixed onto the image stabilization unit 60 by the insulating resin 8, a relative speed difference occurs between the connecting portion on the printed wiring board 17 and the insulating resin 8 unless the elastic member 9 is provided. As a result, a load occurs on the connecting portion of the connector 7.

On the other hand, a case where a part of the flexible printed circuit board 4 is fixed onto the printed wiring board 17 by the elastic member 9 as with the present embodiment is considered in the same manner as the above. In such a case, although there is a relative speed difference between the elastic member 9 and the insulating resin 8 or the connecting portion of the connector of the image processing unit, there is no or an extremely small relative speed difference between the connecting portion of the connector 7 on the imaging sensor module 50 side and the elastic member 9. Thereby, a mechanical load occurring in operation of the image stabilization unit 60 occurs toward the elastic member 9. As a result, it is possible to reduce a load occurring in the connecting portion of the connector 7. Note that the elastic member 9 may be configured in any manner so as to fix (or position) at least a part of the flexible printed circuit board 4 onto the printed wiring board 17 and so that either one of a front face and a back face of the flexible printed circuit board 4 is fixed.

In this configuration, regarding the height of the first component group 10 to which the flexible printed circuit board 4 is fixed via the elastic member 9, it is preferable that the heights of two or more components included in the first component group 10 be the same. With two or more components having the same height, the fixing position of the flexible printed circuit board 4 can be even at the height of the first component group 10, and dispersion of the force applied to the arrangement part of the elastic member 9, which is a reinforcement part, can be even.

Furthermore, it is preferable that the plurality of electronic components of the first component group 10 on the printed wiring board 17 to which the elastic member 9 is fixed be arranged in parallel to the end of the flexible printed circuit board 4 on the side to which the connector 7 is connected. With the electronic components of the first component group 10 being arranged in parallel to the connection end of the connector 7, dispersion of the force applied to the reinforcement part can be more even.

Further, with the connector 7, the elastic member 9, and the insulating resin 8 being aligned and arranged on a straight line, the force can be effectively dispersed.

The fixing position of the elastic member 9 is required to be set such that the flexible printed circuit board 4 mounted on the imaging sensor module 50 and the image stabilization unit 60 do not interfere with each other even when the imaging sensor module 50 operates at the maximum. The condition where the flexible printed circuit board 4 and the image stabilization unit 60 do not interfere with each other will be further described with reference to FIG. 3 to FIG. 5.

Herein, the initial position of the center of the connector 7 on the printed wiring board 17 is defined as the origin O in a plan view of the imaging unit 400 on the XY plane. The initial position of the center of the connector 7 is a position before the imaging sensor module 50 operates. FIG. 1 illustrates the imaging unit 400 in a state occurring before the imaging sensor module 50 operates. Further, the maximum motion amounts of the imaging unit 400 in the ±X direction, the ±Y direction, and ±θ direction defined as described above are denoted as ±ΔX, ±ΔY, and ±Δθ, respectively. Each of the values ±ΔX and ±ΔY is a distance, which is the maximum movement. The value ±Δθ is an angle, which is the maximum rotation.

Further, as illustrated in FIG. 1, the distance in the X direction from the origin O to the image stabilization unit 60 is denoted as Lx. Further, the distance in the Y direction from the origin O to the image stabilization unit 60 is denoted as Ly. Further, the distance in the X direction from the origin O to the position of the elastic member 9 is denoted as X. Note that the distance X is a distance from the origin O to the position of the fixing point of the flexible printed circuit board 4 fixed by the elastic member 9. Further, the width of the flexible printed circuit board 4 in the Y direction is denoted as W (=2Y). In this case, coordinates A (X, W/2) that are the coordinates of the point A and coordinates B (X, −W/2) that are the coordinates of the point B are set as virtual coordinates.

Figure 3:
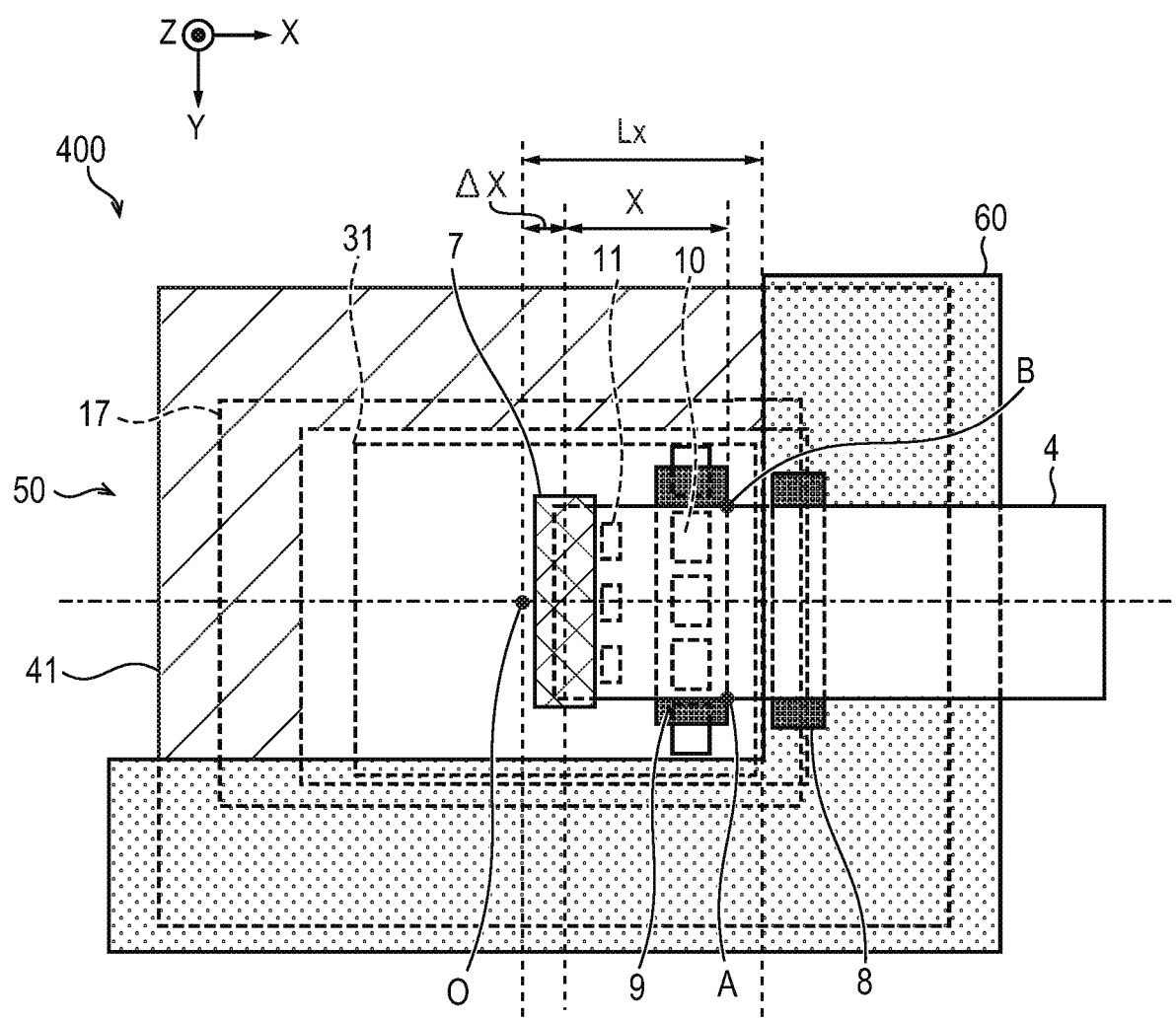
FIG. 3 is a schematic top view illustrating a general configuration after an imaging sensor module has moved by $\Delta X$ in an X direction in the imaging unit according to the first embodiment.

FIG. 3 is a schematic top view illustrating a general configuration after the imaging sensor module 50 has moved by ΔX in the X direction in the imaging unit 400 according to the present embodiment. The condition where the flexible printed circuit board 4 and the image stabilization unit 60 do not interfere with each other when the imaging sensor module 50 has moved by the maximum movement ΔX in the X direction can be expressed by the following equation (1).

$$Lx > X + \Delta X \quad (1)$$

Figure 4:
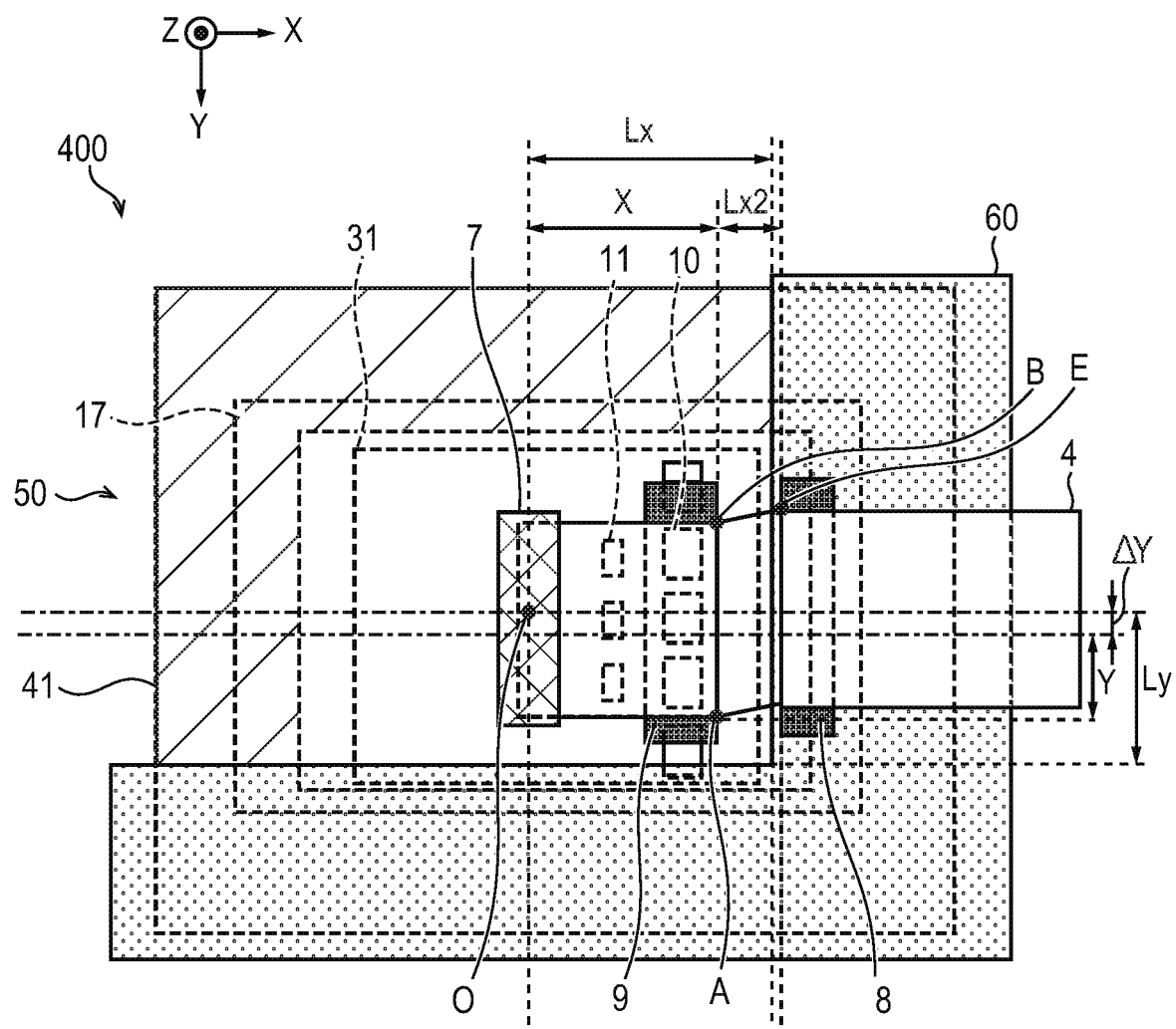
FIG. 4 is a schematic top view illustrating a general configuration after the imaging sensor module has moved by $\Delta Y$ in a Y direction in the imaging unit according to the first embodiment.

FIG. 4 is a schematic top view illustrating a general configuration after the imaging sensor module 50 has moved by ΔY in the Y direction in the imaging unit 400 according to the present embodiment. When a case where the imaging sensor module 50 has moved by the maximum movement ΔY in the Y direction is considered in the same manner, the condition where the flexible printed circuit board 4 and the image stabilization unit 60 do not interfere with each other when the imaging sensor module 50 has moved by the maximum movement ΔY in the Y direction can be expressed by the following equation (2).

$$Ly > W/2 + \Delta Y \quad (2)$$

Figure 5:
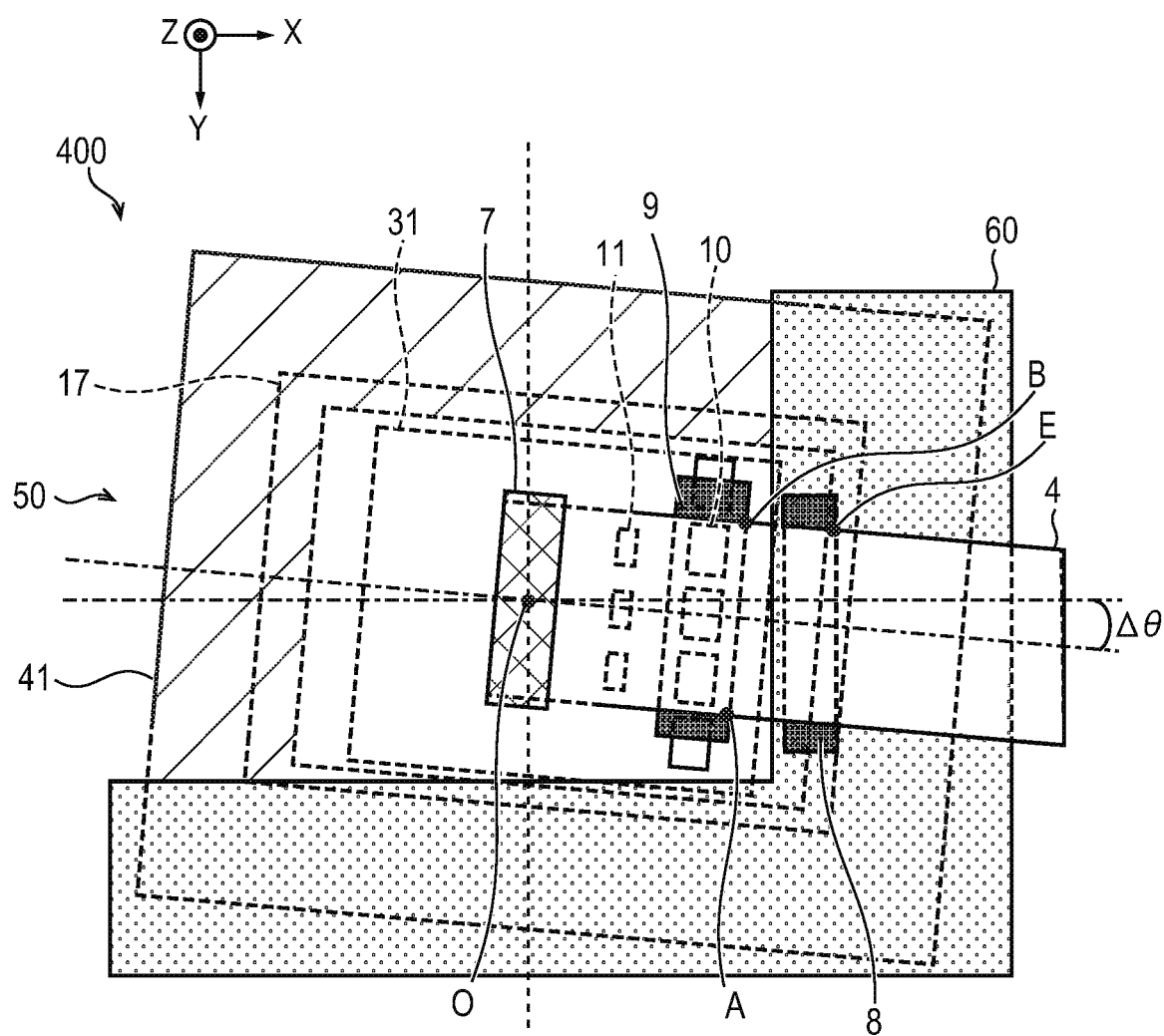
FIG. 5 is a schematic top view illustrating a general configuration after the imaging sensor module has rotated by $\Delta \theta$ in a $\theta$ direction in the imaging unit according to the first embodiment.

FIG. 5 is a schematic top view illustrating a general configuration after the imaging sensor module 50 has rotated by Δθ in the θ direction in the imaging unit 400 according to the present embodiment. The conditional equations in the θ direction will be described below.

Coordinates $(X_A', Y_A')$ after ±Δθ rotation of the coordinates A can be expressed by the following equations, respectively.

$$X_A' = X \cos(\pm\Delta\theta) - (W/2)\sin(\pm\Delta\theta) \quad (3)$$

$$Y_A' = X \sin(\pm\Delta\theta) + (W/2)\cos(\pm\Delta\theta) \quad (4)$$

Similarly, coordinates $(X_B', Y_B')$ after ±Δθ rotation of the coordinates B can be expressed by the following equations, respectively.

$$X_B' = X \cos(\pm\Delta\theta) - (-W/2)\sin(\pm\Delta\theta) \quad (5)$$

$$Y_B' = X \sin(\pm\Delta\theta) + (-W/2)\cos(\pm\Delta\theta) \quad (6)$$

Thus, the conditions where the coordinates A and B do not interfere with the inner end face of the image stabilization unit 60, respectively, can be expressed by the following equations (7) and (8).

$$Lx > X \cos(\Delta\theta) + (W/2)\sin(\Delta\theta) \quad (7)$$

$$Ly > X \sin(\Delta\theta) + (W/2)\cos(\Delta\theta) \quad (8)$$

Further, under the assumption that all of motion in the X direction, motion in the Y direction, and rotation of the θ direction occur at the same time, the condition where the flexible printed circuit board 4 and the image stabilization unit 60 do not interfere with each other can be expressed by the following equations (9) and (10).

$$Lx > \Delta X + X\cos(\Delta\theta) + (W/2)\sin(\Delta\theta) \quad (9)$$

$$Ly > \Delta Y + X\sin(\Delta\theta) + (W/2)\cos(\Delta\theta) \quad (10)$$

As described above, the elastic member 9 can be installed at a position where the imaging sensor module 50 does not interfere with the image stabilization unit 60 when moving with respect to the image stabilization unit 60.

Note that it is preferable that the length of the flexible printed circuit board 4 between the part fixed by the elastic member 9 and the part fixed by the insulating resin 8 have a margin of length with respect to the distance by which the imaging sensor module 50 moves at the maximum so that the flexible printed circuit board 4 is less affected. For example, if this length is equal to the shortest distance between the part fixed by the elastic member 9 and the part fixed by the insulating resin 8, the flexible printed circuit board 4 may be stretched by the maximum $\Delta X$ when the imaging sensor module 50 moves by $\Delta X$. At this time, it is expected that a load to the flexible printed circuit board 4 rather than to the connecting portion of the flexible printed circuit board 4 will significantly appear. Thus, the influence due to such a load is required to be minimized, and a sufficient length of the flexible printed circuit board 4 is required for the movement of the imaging sensor module 50.

Herein, the length of the flexible printed circuit board 4 between the point C fixed by the elastic member 9 and the point D fixed by the insulating resin 8 is denoted as Lfpc. Note that the point C and the point D are points on a straight line along the X direction, respectively. Further, the shortest distance between the point C fixed by the elastic member 9 and the point D fixed by the insulating resin 8 is denoted as Lx2. In this case, when the imaging sensor module 50 moves by the maximum movement $\Delta X$ in the X direction, the condition of the length Lfpc where the load to the flexible printed circuit board 4 becomes small can be expressed by the following equation (11).

$$Lfpc + \Delta X > Lx2 \quad (11)$$

Similarly, when the length of the flexible printed circuit board 4 between the point B and the point E is denoted as Lfpc2 and when the imaging sensor module 50 moves by the maximum movement $\Delta Y$ in the Y direction, the condition of the length Lfpc2 where the load to the flexible printed circuit board 4 becomes small can be expressed by the following equation (12). Note that the point E is a point at which the flexible printed circuit board 4 is fixed by the insulating resin 8, which is a point having the same Y coordinate as the point B.

$$Lfpc2 > \sqrt{\{(Lx2)^2 + (\Delta Y)^2\}} \quad (12)$$

Further, when the imaging sensor module 50 rotates by the maximum rotation $\Delta\theta$ in the $\theta$ direction, the condition of the length Lfpc2 where the load to the flexible printed circuit board 4 becomes small can be expressed by the following equation (13).

$$Lfpc2 > (W/2)\tan(\Delta\theta) + \{Lx2/\cos(\Delta\theta)\} \quad (13)$$

As described above, according to the present embodiment, it is possible to reduce a load occurring in a connecting portion between the flexible printed circuit board 4 and the printed wiring board 17 without involving an increase in size of the printed wiring board 17. According to the present embodiment, it is possible to reinforce the connecting portion between the flexible printed circuit board 4 and the printed wiring board 17 without providing a region for a reinforcement terminal or the like on the printed wiring board 17.

Second Embodiment

Figure 6:
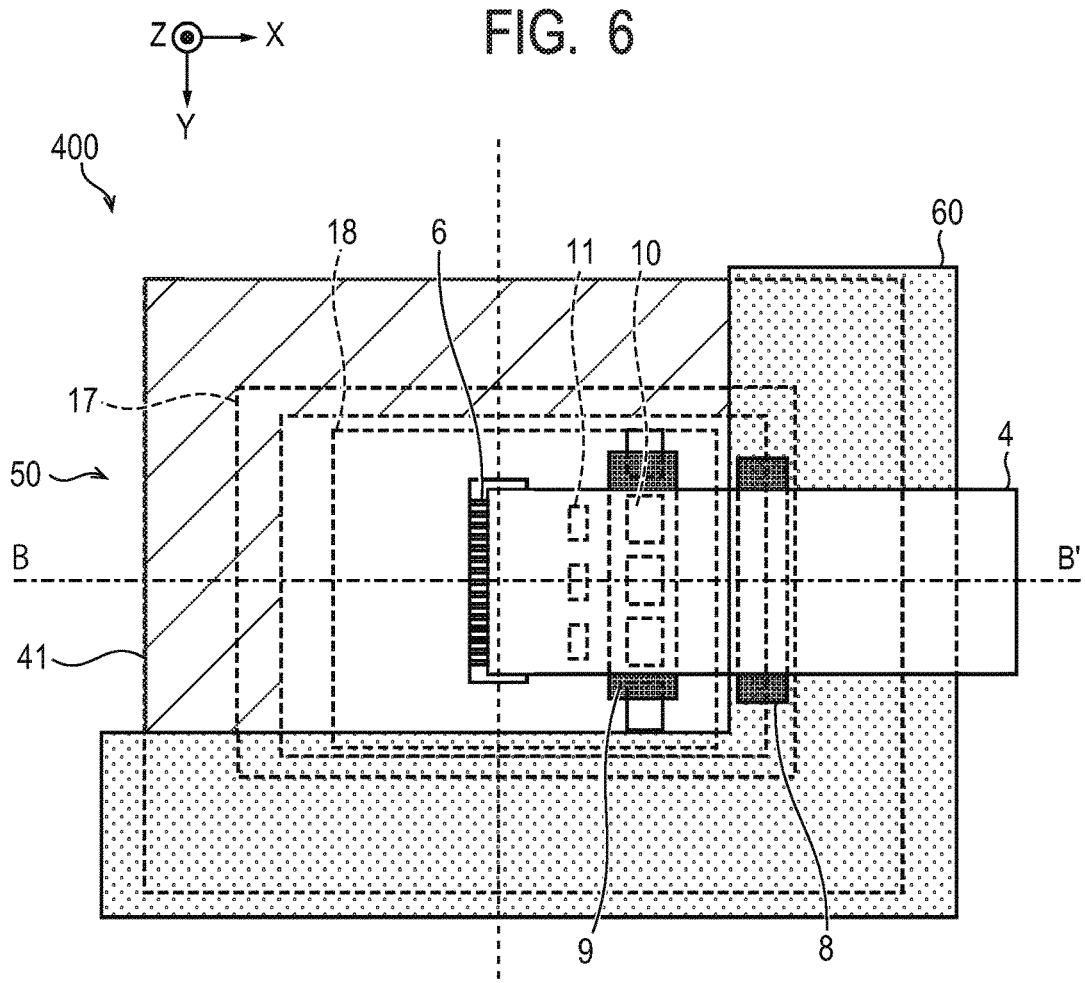
FIG. 6 is a schematic top view illustrating a general configuration of an imaging unit according to a second embodiment.
Figure 7:
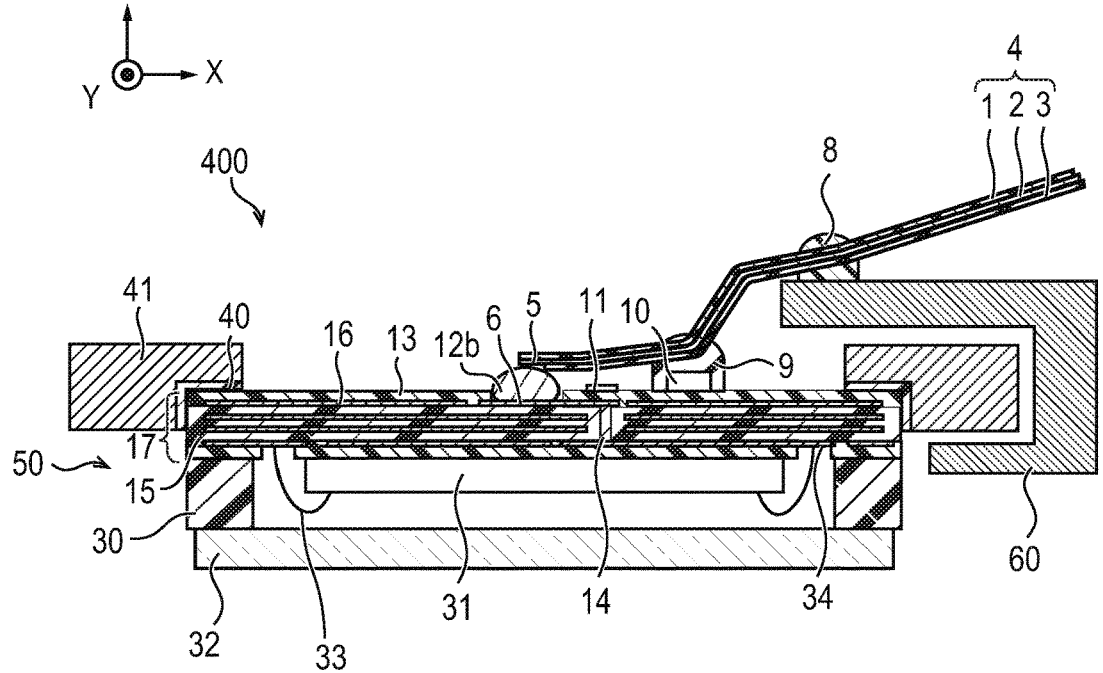
FIG. 7 is a schematic sectional view illustrating a general configuration of the imaging unit according to the second embodiment.

Next, an imaging unit according to a second embodiment will be described with reference to FIG. 6 and FIG. 7. FIG. 6 is a schematic top view illustrating a general configuration of an imaging unit according to the present embodiment. FIG. 7 is a schematic sectional view illustrating the general configuration of the imaging unit according to the present embodiment and illustrates a cross section taken along a line B-B' of FIG. 6.

In the present embodiment, the connection structure between the flexible printed circuit board 4 and the printed wiring board 17 is different from that of the first embodiment. That is, in the present embodiment, each first electrode 5 of the flexible printed circuit board 4 is connected directly to the second electrode 6 of the printed wiring board 17 using conductive member 12b such as solder without via the connector 7. Note that, since other features are the same as those of the first embodiment, the description of the same features will be omitted.

As illustrated in FIG. 6 and FIG. 7, the imaging unit 400 according to the present embodiment has the imaging sensor module 50 having the printed wiring board 17, the image stabilization unit 60, and the flexible printed circuit board 4 in the same manner as the first embodiment.

The flexible printed circuit board 4 has the flexible base 1, the flexible wiring layer 2, and the coverlay 3. The coverlay 3 is not formed at one of the ends of the flexible printed circuit board 4, and the flexible wiring layer 2 is exposed. The exposed portion of the flexible wiring layer 2 forms the first electrodes 5.

The printed wiring board 17 has the printed wiring base 15, the wiring layers 16, and the solder resist layer 13. An opening exposing the wiring layer 16 is formed in the solder resist layer 13. The exposed portion of the wiring layer 16 forms the second electrodes 6.

The first electrode 5 and the second electrode 6 face each other so that at least a part of the first electrode 5 and a part of the second electrode 6 overlap each other in plan view from a direction perpendicular to the printed wiring board 17. The first electrode 5 formed at the end of the flexible printed circuit board 4 and the second electrode 6 of the printed wiring board 17 are joined and connected by the conductive member 12b. The conductive member 12b is a connecting material having solder, for example.

Note that, when a connecting material having solder is used to connect the first electrode 5 and the second electrode 6 to each other, the first electrode 5 and the second electrode 6 can be connected in contact with the connecting material having solder in a state where the connecting material having the solder is heated above the melting point of the solder. Further, for example, the connecting material having solder may be a paste supplied with Sn-3.0% Ag-0.5% Cu solder or Sn-58Bi solder together with flux or may be a material supplied with solder powders being contained in a thermosetting resin or a thermoplastic resin.

As described above, in the present embodiment, the flexible printed circuit board 4 is connected directly to the printed wiring board 17 via the conductive member 12b without via the connector 7. Therefore, according to the present embodiment, it is possible to achieve a reduction in the connection area between the flexible printed circuit board 4 and the printed wiring board 17 in addition to a reduction in the load occurring in the connecting portion between the flexible printed circuit board 4 and the printed wiring board 17.

Third Embodiment

Figure 8:
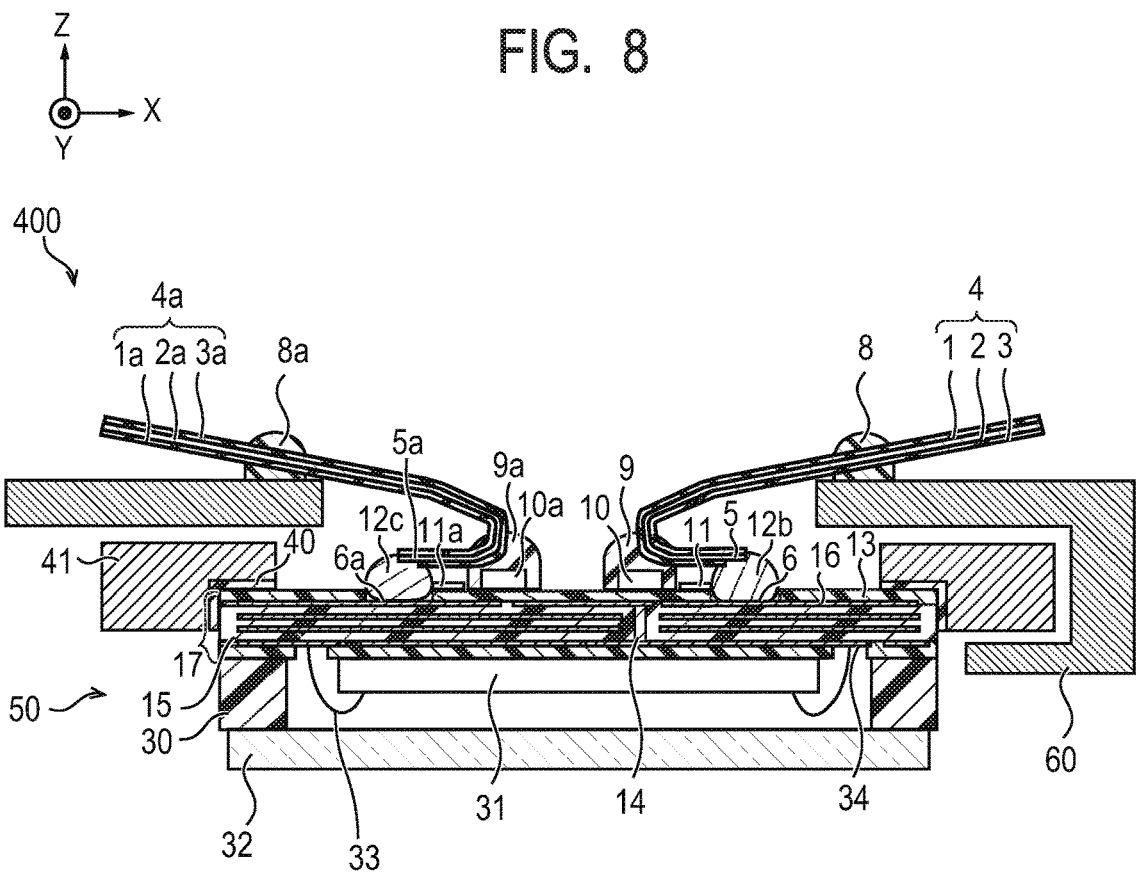
FIG. 8 is a schematic top view illustrating a general configuration of an imaging unit according to a third embodiment.

Next, an imaging unit according to a third embodiment will be described with reference to FIG. 8. FIG. 8 illustrates a schematic sectional view illustrating a general configuration of the imaging unit according to the present embodiment.

In the present embodiment, the connection structure between the flexible printed circuit board 4 and the printed wiring board 17 is basically the same as that of the second embodiment. However, the present embodiment is different from the second embodiment in that the position of the elastic member 9 is more distant from the image stabilization unit 60 than from the connection position between the flexible printed circuit board 4 and the printed wiring board 17 compared to the second embodiment. That is, in the present embodiment, the flexible printed circuit board 4 is folded back at the part connected and fixed to the elastic member 9, as illustrated in FIG. 8. Thus, in the present embodiment, the load (tension) applied to the flexible printed circuit board 4 can be reduced compared to the second embodiment.

Further, the present embodiment is different from the second embodiment in that more than one flexible substrates are provided and the second flexible printed circuit board 4a is provided. The second flexible printed circuit board 4a has the same configuration as the flexible printed circuit board 4, and third electrodes 5a are connected to fourth electrodes 6a in the same manner as the flexible printed circuit board 4. Further, the second flexible printed circuit board 4a is folded back at a part connected and fixed to a second elastic member 9a in the same manner as the flexible printed circuit board 4. In FIG. 8, each feature added due to the addition of the second flexible printed circuit board 4a is illustrated by appending an alphabet to the reference numeral of the corresponding similar feature or changing the alphabet of the reference of the corresponding similar feature.

Note that, in the present embodiment, three or more flexible printed circuit boards 4 may be provided without being limited to two. Further, also in the first embodiment and the second embodiment, two or more flexible printed circuit boards 4 may be provided.

As described above, the present embodiment is structured such that the flexible printed circuit board 4 is connected to the elastic member 9 and then folded and the second flexible printed circuit board 4a is connected to the second elastic member 9a and then folded. Furthermore, in the present embodiment, the flexible printed circuit board 4 and the second flexible printed circuit board 4a, which are a plurality of flexible printed circuit boards, are connected on the same printed wiring board 17. Therefore, the load occurring in the connecting portions between the flexible printed circuit board 4 and the printed wiring board 17 and between the second flexible printed circuit board 4a and the printed wiring board 17 can be reduced. Further, it is possible to achieve a reduction in the connection areas between the flexible printed circuit board 4 and the printed wiring board 17 and between the second flexible printed circuit board 4a and the printed wiring board 17 in addition to a reduction in the tension applied to the flexible printed circuit board 4 and the second flexible printed circuit board 4a. Note that, also in the present embodiment, a single flexible printed circuit board 4 may be provided.

Fourth Embodiment

Figure 9:
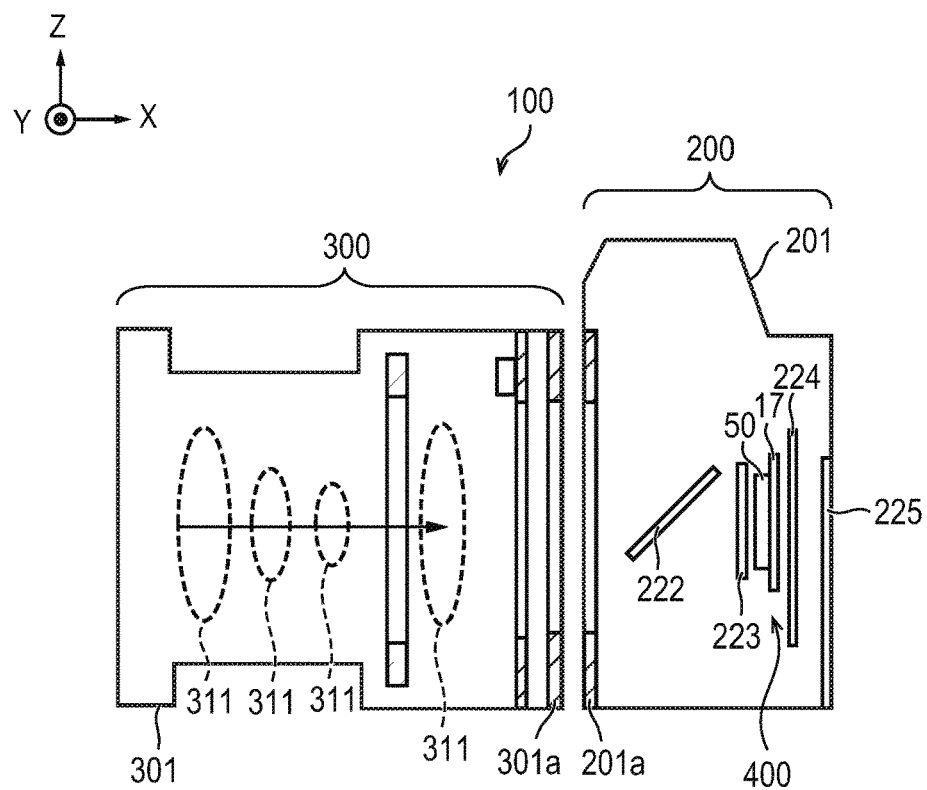
FIG. 9 is a schematic diagram illustrating a general configuration of an imaging apparatus as one example of an electronic device according to a fourth embodiment.

Next, an electronic device according to a fourth embodiment will be described with reference to FIG. 9. FIG. 9 is a schematic diagram illustrating a general configuration of an imaging apparatus as an example of the electronic device according to the present embodiment.

A digital camera (camera) 100 as the imaging apparatus that is an example of the electronic device according to the present embodiment is a digital single-lens reflex camera, for example. As illustrated in FIG. 9, the camera 100 has a camera main body 200 and an interchangeable lens (lens barrel) 300 that is removable from the camera main body 200. In FIG. 9, the interchangeable lens 300 is mounted to the camera main body 200. A case where the interchangeable lens 300 is mounted to the camera main body 200 and thereby the camera 100 that is an imaging apparatus is configured will be described below.

The camera main body 200 has a casing 201 and has a mirror 222, a shutter 223, an imaging unit 400 that is a printed circuit board, and an image processing circuit 224 that are arranged inside the casing 201. Further, the camera main body 200 has a liquid crystal display 225 fixed to the casing 201 so as to be exposed out of the casing 201.

The imaging unit 400 has the configuration described in any of the first embodiment to the third embodiment described above and has the image stabilization unit 60, the imaging sensor module 50 having the printed wiring board 17, and the flexible printed circuit board 4.

The interchangeable lens 300 has a casing 301 that is an interchangeable lens casing and an imaging optical system 311. The imaging optical system 311 is arranged inside the casing 301 and, when the casing 301 (the interchangeable lens 300) is mounted to the casing 201, captures an optical image onto the imaging sensor module 50. The imaging optical system 311 has a plurality of lenses.

The casing 301 of the interchangeable lens 300 has a lens-side mount 301a in which an opening is formed. On the other hand, the casing 201 of the camera main body 200 has a camera-side mount 201a in which an opening is formed. With the lens-side mount 301a and the camera-side mount 201a being fit to each other, the interchangeable lens 300 (the casing 301) is mounted to the camera main body 200 (the casing 201). Note that the arrow X direction illustrated in FIG. 9 is an optical axis direction of the imaging optical system 311.

The light traveling in the arrow X direction along the imaging optical system 311 is guided to the inside of the casing 201 through the opening of the lens-side mount 301a of the casing 301 and the opening of the camera-side mount 201a of the casing 201. The mirror 222, the shutter 223, and the like are provided in front of the imaging unit 400 in the arrow X direction inside the casing 201 along the arrow X direction.

The imaging sensor element 31 in the imaging sensor module 50 is a solid state imaging element such as a CMOS image sensor, a CCD image sensor, or the like that photoelectrically converts an optical image captured by the imaging optical system 311.

In the present embodiment, it is preferable that the flexible printed circuit board 4 and the casing 201 be electrically stable. It is thus preferable that the fixing position of the flexible printed circuit board 4 fixed by the elastic member 9 be a position where the flexible printed circuit board 4 is connected to the printed wiring board 17 with the minimum margin of length that can ensure the strength.

As described above, the camera 100 that is an imaging apparatus including the imaging unit 400 is configured.

As described above, according to the present embodiment, the load occurring in the connecting portion between the flexible printed circuit board 4 and the printed wiring board 17 can be reduced even when the digital single-lens reflex camera is dropped and impacted or the like, for example, and it is therefore possible to improve the performance.

Note that, although the case where the interchangeable lens 300 is mounted to the camera main body 200 and the imaging apparatus is configured has been described in the present embodiment, the present invention is not limited thereto. The camera main body 200 is the imaging apparatus when only the camera main body 200 is provided without the interchangeable lens 300 being mounted.

Further, although the case where the camera 100 is separated into the camera main body 200 and the interchangeable lens 300 has been described in the present embodiment, an integrated-type camera in which a lens is built in the camera main body 200 may be employed.

Furthermore, although the case of the camera 100 as an imaging apparatus that is an electronic device has been described in the present embodiment, the present invention is not limited thereto. The imaging apparatus that is an electronic device may be a mobile device having a printed circuit board having an image sensor package.

Further, although the case where the semiconductor device is an image sensor device, that is, the semiconductor package is an image sensor package has been described in the present embodiment, the present invention is not limited thereto. The semiconductor package may be a memory device, a memory controller, or other semiconductor packages. In such a case, the electronic device on which a printed circuit board is mounted is not limited to the imaging apparatus, and the printed circuit board can be mounted on any electronic devices.

Example 1

The imaging unit 400 according to the first embodiment illustrated in FIG. 1 and FIG. 2 was manufactured as the imaging unit of Example 1. In the imaging unit 400 of Example 1, an ultraviolet curable resin was used as the insulating resin 8, and a thermosetting adhesive agent was used as the elastic member 9. A laminated ceramic capacitor having a shape of a length of 1.0 mm by a width of 0.5 mm by a height of 0.5 mm was used as an electronic component of the first component group 10. Further, the electronic component of the first component group 10 was arranged at a position of a distance of 3 mm from the connector 7 in the X direction. As the frame 30, a resin having a thickness of 2 mm was used. As the imaging sensor element 31, a CMOS image sensor having a rectangular planar shape of 30 mm by 20 mm was used. As the cover glass 32, a cover glass having a rectangular planar shape of 28 mm by 38 mm was used.

As the flexible printed circuit board 4, a flexible printed circuit board in which the material of the flexible base 1 and the coverlay 3 is polyimide and the material of the flexible wiring layer 2 and the first electrode 5 is Cu was used. The thickness of the flexible base 1 was 25 μm, the thickness of the coverlay 3 was 12 μm, and the thickness of the flexible wiring layer 2 was 18 μm.

As the printed wiring board 17, a printed wiring board which has a rectangular external shape of 30 mm by 40 mm and in which the material of the printed wiring base 15 is a glass epoxy material and the material of the wiring layer 16 and the second electrodes 6 is Cu was used. The thickness of the wiring layer 16 and the second electrodes 6 was around 30 μm, and the thickness of the solder resist layer 13 was around 25 μm. Further, as the adhesive agent 40 that fixes the printed wiring board 17 and the metal frame 41 to each other, an ultraviolet curable resin was used. As the metal frame 41, a metal frame having an external shape of 50 mm by 60 mm was used.

The connector 7 was connected to the second electrodes 6 provided in the center part of the printed wiring board 17 by the conductive members 12a that are solder. As the connector 7, a connector having an external shape of 20 mm by 2.0 mm, a pitch of 0.5 mm, and the number of wirings of 20 was used. As solder of the conductive member 12a, solder whose material is Sn-3.0% Ag-0.5% Cu was used. As the image stabilization unit 60, an image stabilization unit having an L-shape in which a rectangle of 70 mm by 55 mm is cut from a rectangle of 85 mm by 70 mm was used. The pitch of electrodes, the width of each electrode, the width between electrodes, the number of electrodes, and the like were set as appropriate in accordance with the specification of the imaging sensor module.

The imaging apparatus with the completed imaging unit 400 of Example 1 mounted was able to sufficiently ensure the optical performance of the built-in CMOS image sensor.

Example 2

The imaging unit 400 according to the second embodiment illustrated in FIG. 6 and FIG. 7 was manufactured as the imaging unit of Example 2. The imaging unit 400 of Example 2 is different from the imaging unit 400 of Example 1 in that each first electrode 5 and the printed wiring board 17 are connected to each other via the conductive member 12b without via the connector 7.

The same flexible printed circuit board 4 as that of Example 1 was used. Further, the printed wiring board 17 which is the same as that of Example 1 except for the feature related to the connector 7 was used.

Each first electrode 5 and each second electrode 6 are connected to each other by the conductive member 12b that is solder. In the second electrodes 6, the pitch was 0.2 mm, the width of each electrode was 0.15 mm, and the number of wirings was 80. Further, the size of the opening of the solder resist layer 13 in which the second electrodes 6 is exposed was 1.1 mm by 20 mm. On the other hand, in the first electrodes 5, the pitch was 0.2 mm, the width of each electrode was 0.1 mm, and the number of wirings was 80. The width of the wirings of the flexible printed circuit board 4 in the pitch direction was 22 mm, which is larger than 20 mm that is the opening width of the solder resist layer 13. The pitch of electrodes, the width of an electrode, the width between electrodes, the number of electrodes, and the like were set as appropriate in accordance with the specification of the imaging sensor module.

The imaging apparatus with the completed imaging unit 400 of Example 2 mounted was able to sufficiently ensure the optical performance of the built-in CMOS image sensor. Further, in Example 2, the flexible printed circuit board 4 is connected directly to the printed wiring board 17 via the conductive members 12b without via the connector 7, thereby connection can be made at a narrower pitch than that of Example 1, and a reduction in the area of the connection region can be achieved.

Evaluation by Structural Analysis

To confirm the effect and advantage of the present invention, an example of performing structural analysis with simplified structure including the flexible printed circuit board 4 and the printed wiring board 17 will be illustrated.

Figure 10:
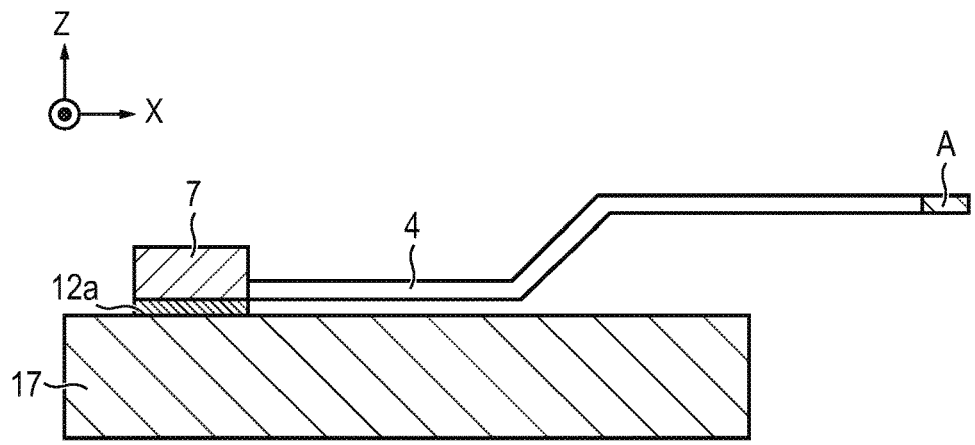
FIG. 10 is a schematic diagram illustrating a two-dimensional structural analysis model according to Comparative example 1.
Figure 11:
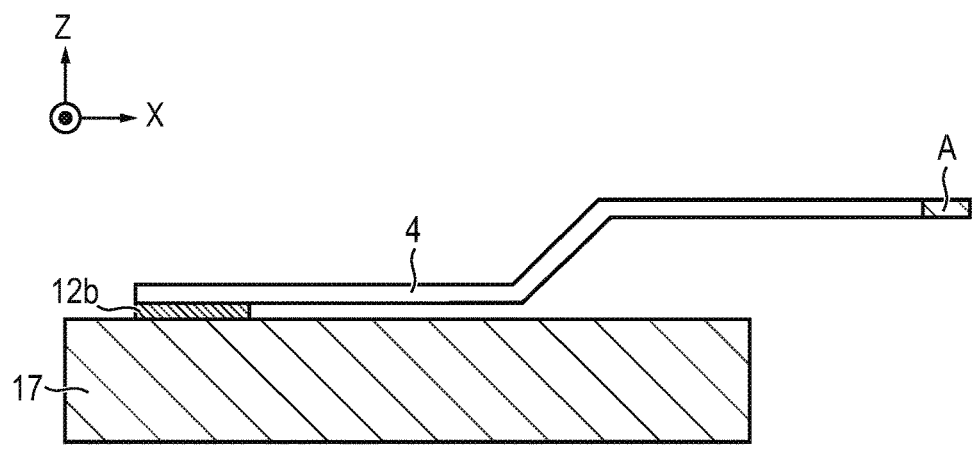
FIG. 11 is a schematic diagram illustrating a two-dimensional structural analysis model according to Comparative example 2.

FIG. 10 is a schematic diagram illustrating the structure as Comparative example 1 in which the flexible printed circuit board 4 is connected to the connector 7 connected onto the printed wiring board 17 by using the conductive member 12a. FIG. 11 is a schematic diagram illustrating the structure as Comparative example 2 in which the flexible printed circuit board 4 is connected to the printed wiring board 17 by using the conductive member 12b. In each of Comparative examples 1 and 2, fixing of the flexible printed circuit board 4 by using the elastic member 9 was not performed.

Figure 12:
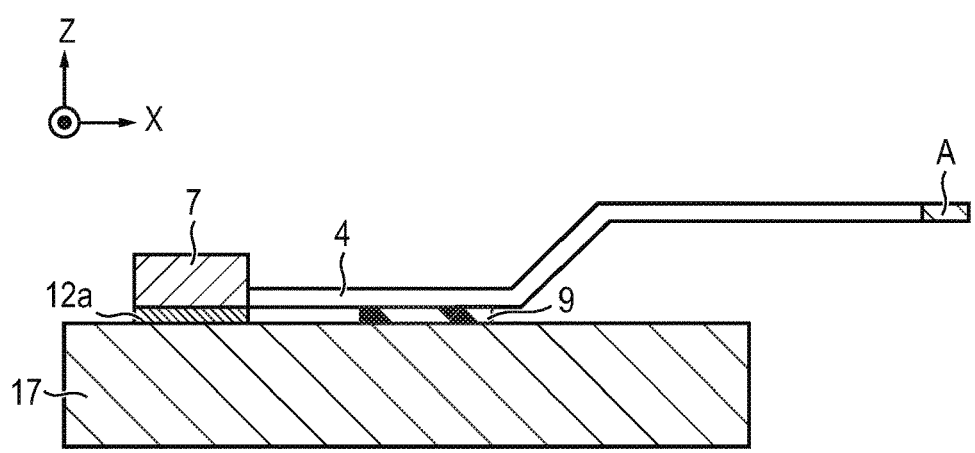
FIG. 12 is a schematic diagram illustrating a two-dimensional structural analysis model according to Example 3.
Figure 13:
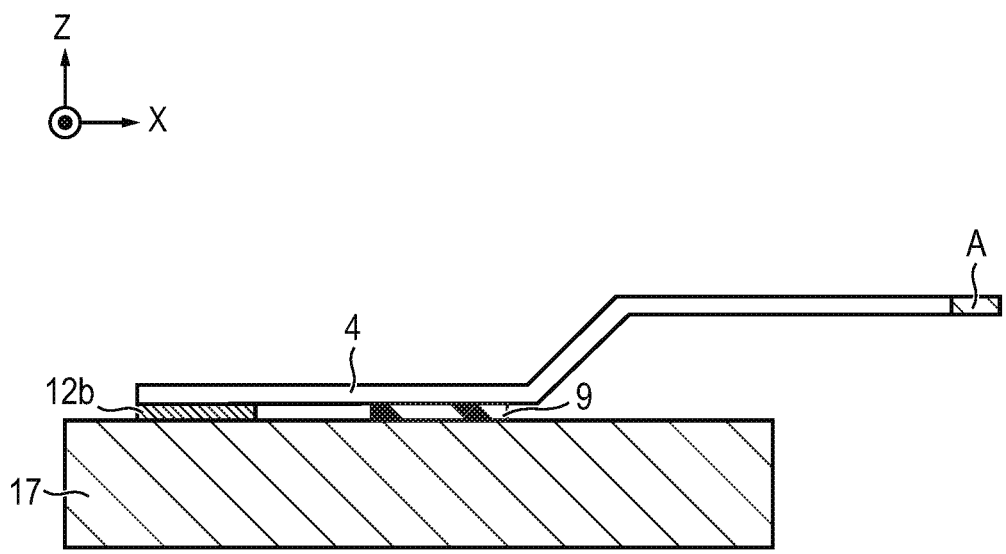
FIG. 13 is a schematic diagram illustrating a two-dimensional structural analysis model according to Example 4.

On the other hand, FIG. 12 is a schematic diagram illustrating the structure as Example 3 in which the flexible printed circuit board 4 is connected to the connector 7 connected onto the printed wiring board 17 by using the conductive member 12a and the printed wiring board 17 and the flexible printed circuit board 4 are fixed to each other by the elastic member 9. FIG. 13 is a schematic diagram illustrating the structure as Example 4 in which the flexible printed circuit board 4 is connected to the printed wiring board 17 by using the conductive member 12b and the printed wiring board 17 and the flexible printed circuit board 4 are fixed to each other by the elastic member 9.

The structural analysis scheme used in the analysis will be described. As the structural analysis software, ANSYS Mechanical Enterprise Version 19.1 was used. As the structural analysis, two-dimensional analysis was performed.

The dimensions or the like used in the structural analysis will be described. Regarding the printed wiring board 17, the length was 2.5 mm, and the thickness was 0.8 mm. The conductive members 12a and 12b were solder, the length from the part at a distance of 1 mm from the end face of the printed wiring board 17 in the X direction was 2 mm, and the solder height in the Z direction was 30 µm. The flexible printed circuit board 4 was a polyimide homogeneous substance, and the thickness thereof was 100 µm. The elastic member 9 was arranged at a position at a distance of 6 mm from the conductive members 12a and 12b in the X direction. Further, the end of the flexible printed circuit board 4 opposite to the connecting portion was defined as a region A, and the region A was assumed to be a fixing part to the image stabilization unit 60 by the insulating resin 8.

The conditions for the structural analysis were as follows. The region A of the flexible printed circuit board 4 was set as displacement 0 in the X direction and the Z direction. Furthermore, in the printed wiring board 17, a node on the back face that is a face not connected to the flexible printed circuit board 4 was set as displacement 0 in the Z direction, and the displacement in the −X direction was set to 1 mm. The structural analysis was performed under the above conditions for all of Comparative examples 1 and 2 and Examples 3 and 4.

Figure 14:
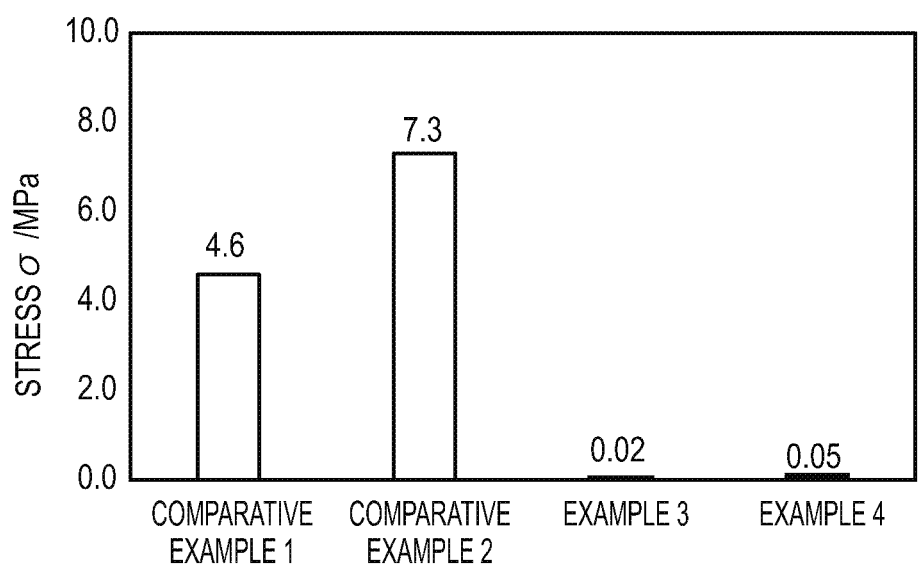
FIG. 14 is a diagram illustrating results of structural analysis of Comparative examples 1 and 2 and Examples 3 and 4 for comparison.

The evaluation criterion was the maximum value of the corresponding stress occurring in the conductive members 12a and 12b. The structural analysis was performed in the conditions described above, and the stress values occurring in the conductive members 12a and 12b were compared. FIG. 14 illustrates a result of stress analysis performed in the structural analysis.

As illustrated in FIG. 14, in comparison between Comparative examples 1 and 2, it is understood that the stress occurring in the conductive member 12b of Comparative example 2 is higher than the stress occurring in the conductive member 12a of Comparative example 1. Further, it is understood that the stress occurring in the conductive members 12a and 12b is around 1/100 times smaller in Examples 3 and 4 than in both Comparative examples 1 and 2.

As described above, according to the present invention, it was confirmed that it is possible to reduce a load occurring in a connecting portion between a flexible printed circuit board and a printed wiring board without involving an increase in size of the printed wiring board. According to the present invention, it is possible to provide a low cost and space saving connection structure that can firmly connect the flexible printed circuit board and the printed wiring board directly and at a narrow pitch without providing a notch part or a connection region for a reinforcement terminal in the printed wiring board or the flexible printed circuit board.

Other Embodiments

The embodiments and examples described above are mere exemplary illustrations of some aspects to which the present invention is applicable. That is, the present invention is not limited to the embodiments and examples described above, and modification or change can be made as appropriate within the scope not departing from the spirit of the present invention.

Although the imaging apparatus and the image processing semiconductor device have been illustrated as an example of electronic devices in the embodiments described above, the present invention is applicable to other electronic components, for example, a memory integrated circuit (IC), a power supply IC, or the like. Further, the present invention is applicable to any electronic device having an external terminal of a Ball Grid Array (BGA) or a Land Grid Array (LGA) other than semiconductor devices.

Further, although the digital camera 100 has been illustrated as an example of electronic devices in the embodiment described above, the electronic devices are not limited thereto. The present invention is applicable to any electronic devices such as a mobile communication device in addition to a digital camera.

According to the present embodiment, it is possible to reduce a load occurring in a connecting portion between a flexible printed circuit board and a printed wiring board without involving an increase in size of the printed wiring board.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-096334, filed May 22, 2019, which is hereby incorporated by reference herein in its entirety.

What is claimed is:

1. An imaging unit comprising:
an imaging sensor module having a printed wiring board on which an imaging element is provided;
a flexible printed circuit board connected to a connecting portion of the printed wiring board;
an elastic member provided on a face having the connecting portion of the printed wiring board; and
an image stabilization unit having a fixing portion that fixes the flexible printed circuit board,
wherein the imaging sensor module is movable with respect to the image stabilization unit, and
wherein the elastic member holds the flexible printed circuit board.

2. The imaging unit according to claim 1, wherein the connecting portion is a connector.

3. The imaging unit according to claim 1, wherein the connecting portion is formed with an electrode of the printed wiring board and an electrode of the flexible printed circuit board being connected to each other via solder.

4. The imaging unit according to claim 1, wherein the flexible printed circuit board is in contact with the connecting portion, the elastic member, and the fixing portion in order.

5. The imaging unit according to claim 1, wherein the connecting portion is arranged at a position overlapping the imaging element when viewed in plan from the face having the connecting portion of the printed wiring board.

6. The imaging unit according to claim 1,
wherein one or more electronic components are provided on the face having the connecting portion of the printed wiring board, and
wherein the elastic member is provided on an electronic component of the one or more electronic components.

7. The imaging unit according to claim 6,
wherein a plurality of the electronic components is provided, and
wherein heights of at least two of the electronic components are the same.

8. The imaging unit according to claim 1, wherein the elastic member is arranged between the fixing portion and the connecting portion.

9. The imaging unit according to claim 1, wherein the elastic member is an ultraviolet curable resin.

10. The imaging unit according to claim 1, wherein the elastic member is installed at a position that does not interfere with the image stabilization unit when the imaging sensor module moves with respect to the image stabilization unit.

11. The imaging unit according to claim 1, wherein the fixing portion is a resin that fixes the flexible printed circuit board to the image stabilization unit.

12. The imaging unit according to claim 1, wherein the image stabilization unit is provided above a circumference edge of the face having the connecting portion of the printed wiring board.

13. An imaging apparatus comprising a casing and an imaging unit inside the casing, wherein the imaging unit is the imaging unit according to claim 1.

14. The imaging apparatus according to claim 13, wherein the imaging apparatus is a camera.

* * * * *